(12) United States Patent
Hsiao et al.

(10) Patent No.: US 12,388,420 B2
(45) Date of Patent: Aug. 12, 2025

(54) NOISE FILTER CIRCUIT WITH CONTROLLABLE TRANSISTOR OFF-RESISTANCE AND ASSOCIATED NOISE FILTERING METHOD

(71) Applicant: MEDIATEK INC., Hsin-Chu (TW)

(72) Inventors: Chuan-Hung Hsiao, Hsinchu (TW); Sung-Han Wen, Hsinchu (TW)

(73) Assignee: MEDIATEK INC., Hsinchu (TW)

(*) Notice: Subject to any disclaimer, the term of this patent is extended or adjusted under 35 U.S.C. 154(b) by 282 days.

(21) Appl. No.: 18/144,839

(22) Filed: May 8, 2023

(65) Prior Publication Data

US 2023/0396152 A1 Dec. 7, 2023

Related U.S. Application Data

(60) Provisional application No. 63/347,601, filed on Jun. 1, 2022.

(51) Int. Cl.
*H03M 1/66* (2006.01)
*H03H 11/04* (2006.01)

(52) U.S. Cl.
CPC .................... *H03H 11/04* (2013.01)

(58) Field of Classification Search
CPC ..... H03H 11/04; H03H 11/0405; H03M 1/06; H03M 1/0626
USPC .......................................... 341/118, 143, 144
See application file for complete search history.

(56) References Cited

U.S. PATENT DOCUMENTS

| | | | |
|---|---|---|---|
| 5,384,570 A | * | 1/1995 | Dedic .................. G11C 27/026 |
| | | | 341/172 |
| 5,999,043 A | | 12/1999 | Zhang |
| 9,660,592 B2 | | 5/2017 | Takase |
| 2016/0173072 A1 | | 6/2016 | Taghivand |
| 2020/0389133 A1 | * | 12/2020 | Hiraoka .................. H03F 1/223 |
| 2022/0123734 A1 | | 4/2022 | Londak |

FOREIGN PATENT DOCUMENTS

| | | |
|---|---|---|
| EP | 0 849 878 A2 | 6/1998 |
| EP | 0 849 878 A3 | 6/2002 |
| EP | 2 982 996 A1 | 2/2016 |

(Continued)

OTHER PUBLICATIONS

Jordi Sacristan et al., Low Noise Amplifier for Recording Eng Signals in Implantable Systems, ISCAS, 2004, pp. 33-36, IEEE, XP010719730, 2004.

(Continued)

*Primary Examiner* — Peguy Jean Pierre
(74) *Attorney, Agent, or Firm* — Winston Hsu

(57) ABSTRACT

A noise filter circuit includes a filter and a transistor off-resistance control circuit. The filter includes a first transistor and a charge storage component. The first transistor has off-resistance when turned off or operated under sub-threshold region. A control terminal of the first transistor is not directly tied to a reference voltage, and is used to receive a first control voltage. The charge storage component has one terminal coupled to a connection terminal of the first transistor. The transistor off-resistance control circuit is coupled to the first transistor, and arranged to set the first control voltage for controlling the off-resistance of the first transistor.

20 Claims, 14 Drawing Sheets

(56) References Cited

FOREIGN PATENT DOCUMENTS

EP      3 026 816 A1    6/2016
TW      201401769 A     1/2014

OTHER PUBLICATIONS

N. Neshatvar et al., Design of Low Frequency Analog Low Pass Filter Using Tunable Pseudo Resistors, 2014 Middle East Conference on Biomedical Engineering (MECBME), Feb. 17-20, 2014, pp. 39-42, IEEE, Doha, Qatar, XP032584277, Feb. 17, 2014.

Lo, A 116 µW 104.4dB-DR 100.6dB-SNDR CT ΔΣ Audio ADC Using Tri-Level Current-Steering DAC with Gate-Leakage Compensated Off-Transistor-Based Bias Noise Filter, ISSCC 2021 / Session 10/ Continuoous-Time ADCs and DACs / 10. 1, pp. 164-166, 2021.

Wen, A—105dBc THD+N (−114dBc HD2) at 2.8VPP Swing and 120dB DR Audio Decoder with Sample-and-Hold Noise Filtering and Poly Resistor Linearization Schemes, ISSCC 2019 / Session 18 / Analog Techniques / 18. 1, pp. 294-296, 2019.

* cited by examiner

NOISE FILTER CIRCUIT WITH CONTROLLABLE TRANSISTOR OFF-RESISTANCE AND ASSOCIATED NOISE FILTERING METHOD

CROSS REFERENCE TO RELATED APPLICATIONS

This application claims the benefit of U.S. Provisional Application No. 63/347,601, filed on Jun. 1, 2022. The content of the application is incorporated herein by reference.

BACKGROUND

The present invention relates to a filter design, and more particularly, to a noise filter circuit with controllable transistor off-resistance and an associated noise filtering method.

A reference generator is commonly used to provide a constant voltage as a bias voltage needed by a processing circuit such as a digital-to-analog (DAC) cell. To make the reference generator meet the low-noise requirements, large current dissipation or source-degeneration is needed to reduce the thermal and flicker noise. However, the reference generator with large current dissipation suffers from increased power consumption, and the reference generator with large source-degeneration suffers from limited headroom of supply voltage shrinking.

One typical solution is to add a low-pass filter at the output of the reference generator. However, the low-pass filter needs large resistance/capacitance for low corner frequency such as audio bandwidth (<20 Hz), which causes huge area consumption and cannot be implemented using on-chip resistor/capacitor. To address these issues, a sample-and-hold noise filter with a switch controlled by pulse-width modulation (PWM) pulses or a continuous-time noise filter with gate leakage variation compensation may be used. However, regarding the typical sample-and-hold noise with the switch controlled by PWM pulses, the control signal of the switch circuit will generate tones at low-frequency band that interferes with audio signals of an audio application. Regarding the typical continuous-time noise filter with gate leakage variation compensation, it suffers from slow settling time due to large time constant as well as large voltage variation at operational amplifier output caused by large transistor off-resistance. The slow settling time of the typical continuous-time noise filter exceeds the acceptable latency for an audio output. The typical continuous-time noise filter with large operational amplifier output is not applicable to low-voltage applications. In addition, leakage current of the transistor with large off-resistance also causes undesired mismatch between an input voltage and an output voltage of the noise filter. Thus, there is a need for an innovative noise filter which is capable of reducing the transistor off-resistance.

SUMMARY

One of the objectives of the claimed invention is to provide a noise filter circuit with controllable transistor off-resistance and an associated noise filtering method.

According to a first aspect of the present invention, an exemplary noise filter circuit includes a filter and a transistor off-resistance control circuit. The filter includes a first transistor and a charge storage component. The first transistor is arranged to have off-resistance when turned off or operated under sub-threshold region, and comprises: a control terminal, arranged to receive a first control voltage, wherein the control terminal is not directly tied to a reference voltage; a first connection terminal; and a second connection terminal. The charge storage component has one terminal coupled to the second connection terminal of the first transistor. The transistor off-resistance control circuit is coupled to the first transistor, and arranged to set the first control voltage for controlling the off-resistance of the first transistor.

According to a second aspect of the present invention, an exemplary noise filtering method is disclosed. The exemplary noise filtering method includes: setting a control voltage at a control terminal of a transistor for controlling off-resistance of the transistor, wherein the control terminal of the transistor is not directly tied to a reference voltage; and performing a filtering operation upon an input voltage to generate an output voltage, wherein the filtering operation is based on the transistor and a charge storage component.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . .". Also, the term "couple" is intended to mean either an indirect or direct electrical connection. Accordingly, if one device is coupled to another device, that connection may be through a direct electrical connection, or through an indirect electrical connection via other devices and connections.

Figure 1:
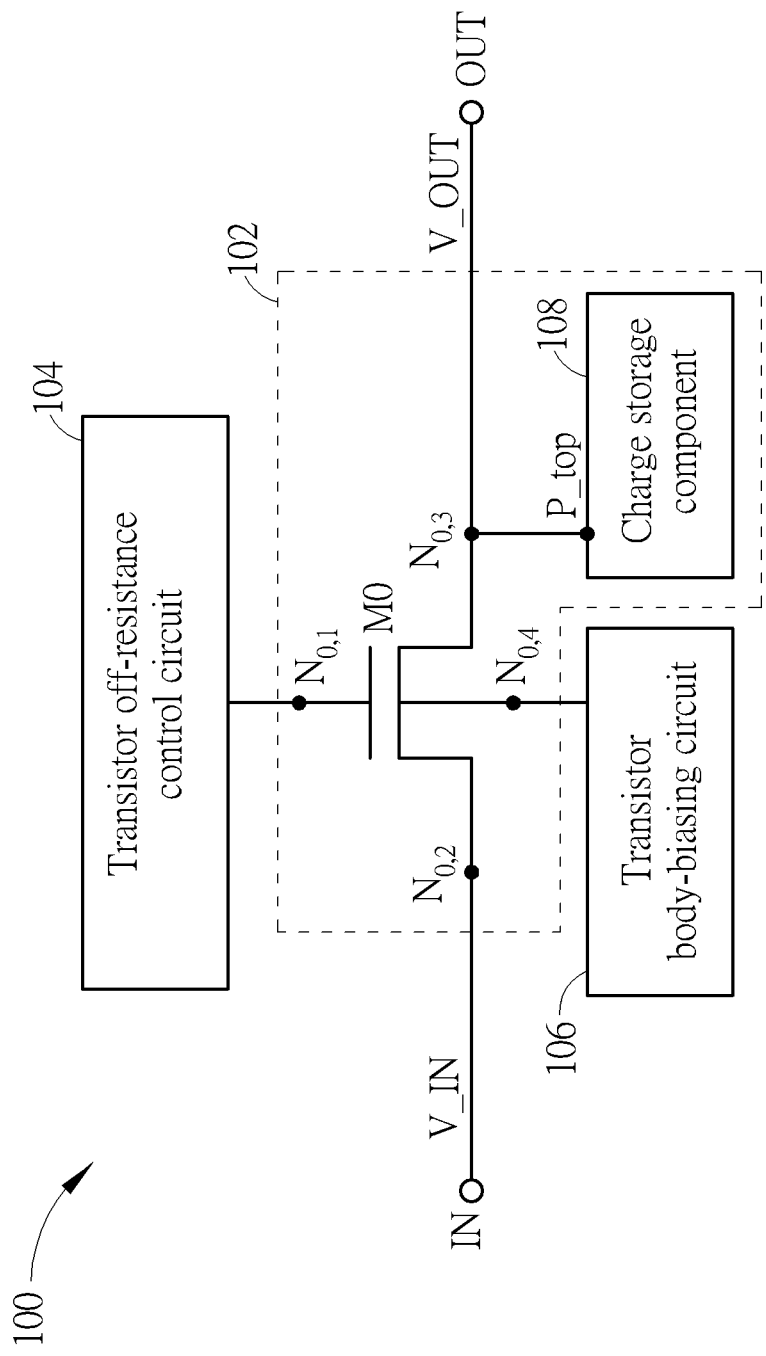
FIG. 1 is a diagram illustrating one noise filter circuit according to an embodiment of the present invention.

FIG. 1 is a diagram illustrating one noise filter circuit according to an embodiment of the present invention. Byway of example, but not limitation, the noise filter circuit 100 may be employed by an audio application. The noise filter circuit 100 includes a filter 102, a transistor off-resistance control circuit 104, and a transistor body-biasing circuit 106. It should be noted that the transistor body-biasing circuit 106 may be optional, depending upon actual design considerations. In this embodiment, the filter 102 includes a transistor M0 and a charge storage component (e.g., an on-chip capacitor) 108. The transistor M0 may be implemented by a P-channel metal-oxide-semiconductor (PMOS) transistor or an N-channel metal-oxide-semiconductor (NMOS) transistor, depending upon actual design considerations. The transistor M0 is arranged to have off-resistance Roff,0 when turned off or operated under sub-threshold region. For example, the filter 102 is configured to act as a low-pass filter such as a continuous-time low-pass filter, where the transistor M0 is used to generate a large resistance with the off-resistance Roff,0. As shown in FIG. 1, the transistor M0 is a four-terminal device including a control terminal (e.g., a gate terminal) $N_{0,1}$, two connection terminals (e.g., a source terminal and a drain terminal) $N_{0,2}$, $N_{0,3}$, and a body terminal $N_{0,4}$. The control terminal (e.g., gate terminal) $N_{0,1}$ is arranged to receive a control voltage (e.g., a gate voltage) that is intentionally set to turn off the transistor M0, thereby making the transistor M0 act as a resistor with the off-resistance Roff,0. The body terminal $N_{0,4}$ is arranged to receive a body voltage that is applied to the bulk/body/substrate of the transistor M0 and can be controlled to affect a threshold voltage of the transistor M0. In this embodiment, the body voltage is provided by the transistor body-biasing circuit 106. That is, the bulk/body/substrate of the transistor M0 can be driven by the transistor body-biasing circuit 106. The connection terminal $N_{0,2}$ is arranged to receive an input voltage V_IN of the filter (e.g., low-pass filter) 102 from an input port IN of the noise filter circuit 100. The connection terminal $N_{0,3}$ is arranged to output an output voltage V_OUT of the filter (e.g., low-pass filter) 102 to an output port OUT of the noise filter circuit 100. The charge storage component (e.g., on-chip capacitor) 108 has one terminal P_top coupled to the connection terminal $N_{0,3}$ of the transistor M0. It should be noted that the control terminal $N_{0,1}$ is not directly tied to a reference voltage such as a supply voltage VDD or a ground voltage GND, and the control voltage is provided through the transistor off-resistance control circuit 104. Hence, with the help of the proposed transistor off-resistance control circuit 104, the control voltage at the control terminal $N_{0,1}$ is controllable, such that the transistor M0 with controllable off-resistance Roff,0 can be achieved.

In the embodiment shown in FIG. 1, the transistor off-resistance control circuit 104 is arranged to control the off-resistance of only a single transistor (e.g., transistor M0). However, this is for illustrative purposes only, and is not meant to be a limitation of the present invention. In some embodiments of the present invention, a noise filter circuit may have more than one transistor that is turned off (or operated under sub-threshold region) to act as a resistor with the off-resistance. The proposed transistor off-resistance control circuit can be used to control the off-resistance of more than one transistor.

Figure 2:
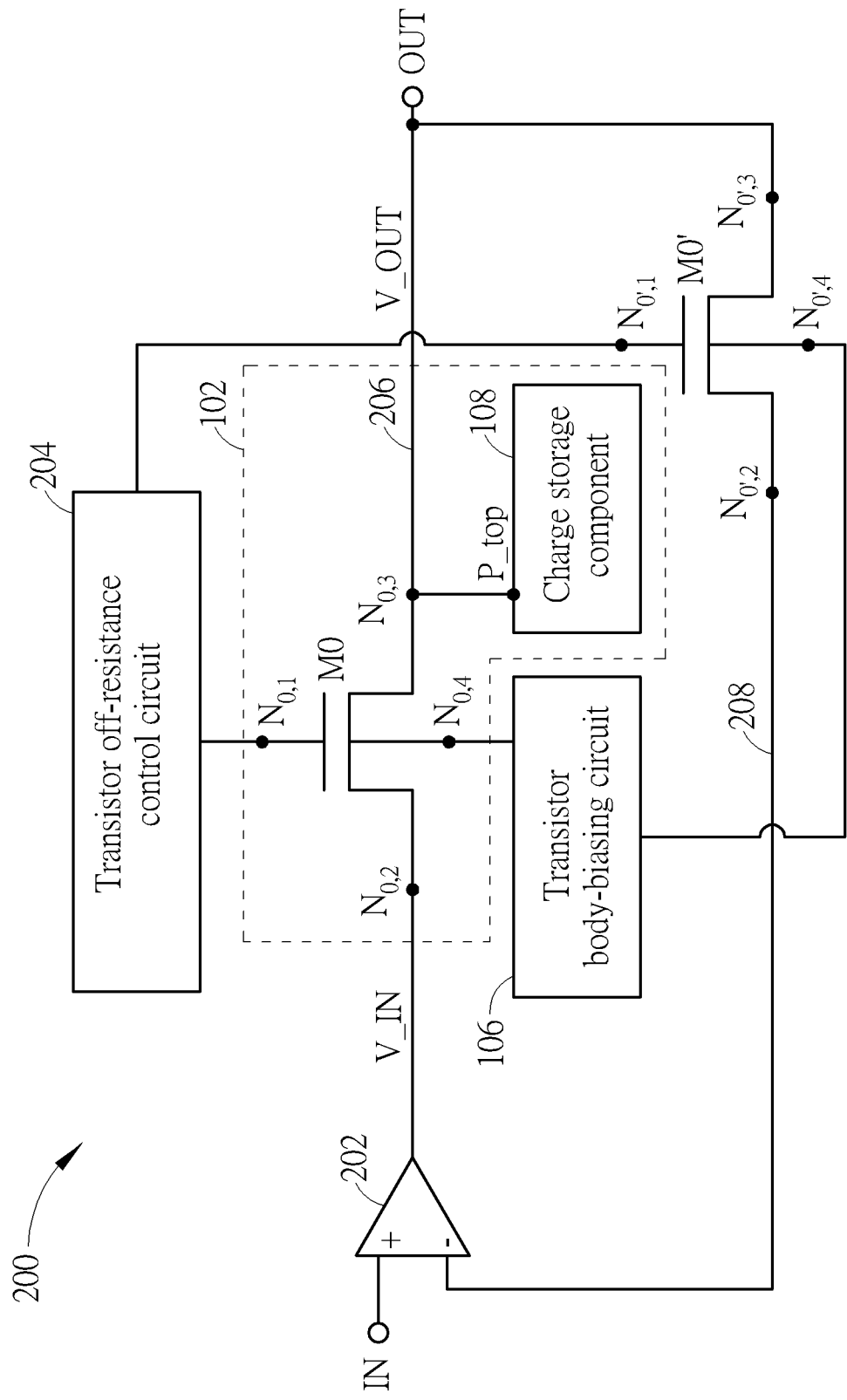
FIG. 2 is a diagram illustrating another noise filter circuit according to an embodiment of the present invention.

FIG. 2 is a diagram illustrating another noise filter circuit according to an embodiment of the present invention. Byway of example, but not limitation, the noise filter circuit 200 may be employed by an audio application. The noise filter circuit 200 includes an operational amplifier 202, a transistor off-resistance control circuit 204, a transistor M0', and the aforementioned filter (e.g., low-pass filter) 102 and transistor body-biasing circuit 106. The transistor M0 of the aforementioned filter 102 is located at a forward path 206, while the transistor M0' is located at a feedback path 208. It should be noted that the transistor body-biasing circuit 106 may be optional, depending upon actual design considerations. In addition, the transistor M0 may be implemented by a PMOS transistor or an NMOS transistor, depending upon actual design considerations; and the transistor M0' may be implemented by a PMOS transistor or an NMOS transistor, depending upon actual design considerations. Like the transistor M0, the transistor M0' is arranged to have off-resistance Roff,0' when turned off or operated under sub-threshold region.

The operational amplifier 202 has two input terminals and an output terminal, where one of the input terminals is a non-inverting input terminal (+) that is coupled to the input port IN of the noise filter circuit 200, the other of the input terminals is an inverting input terminal (−) coupled to the feedback path 208, and the output terminal is coupled to the forward path 206. As shown in FIG. 2, the transistor M0' is a four-terminal device including a control terminal (e.g., a gate terminal) $N_{0',1}$, two connection terminals (e.g., a source terminal and a drain terminal) $N_{0',2}$, $N_{0',3}$, and a body terminal $N_{0',4}$. The control terminal (e.g., gate terminal) $N_{0',1}$ is arranged to receive a control voltage (e.g., a gate voltage) that is intentionally set to turn off the transistor M0', thereby making the transistor M0' act as a resistor with the off-resistance Roff,0'. The body terminal $N_{0',4}$ is arranged to receive a body voltage that is applied to the bulk/body/substrate of the transistor M0' and can be controlled to affect the threshold voltage of the transistor M0'. In this embodiment, the body voltage is also provided by the transistor body-biasing circuit 106. That is, the bulk/body/substrate of each of the transistors M0 and M0' is driven by the same transistor body-biasing circuit 106. The connection terminal $N_{0',2}$ is coupled to the inverting input terminal (−) of the operational amplifier 202. The connection terminal $N_{0',3}$ is coupled to the connection terminal $N_{0,3}$ of the transistor M0. It should be noted that the control terminal $N_{0',1}$ is not directly tied to a reference voltage such as a supply voltage VDD or a ground voltage GND, and the control voltage is provided through the transistor off-resistance control circuit 204. The transistor off-resistance control circuit 204 is arranged to control off-resistance of both transistors M0 and M0'. Hence, with the help of the proposed transistor off-resistance control circuit 204, the control voltages at the control terminals $N_{0,1}$ and $N_{0',1}$ are controllable, such that the transistor M0 with controllable off-resistance Roff,0 and the transistor M0' with controllable off-resistance Roff,0' can be achieved.

As mentioned above, the transistor off-resistance control circuit 104/204 is arranged to set the control voltage (e.g., gate voltage) at the control terminal $N_{0,1}$ (e.g., gate terminal)

of the transistor (e.g., PMOS transistor or NMOS transistor) M0 for controlling the off-resistance Roff,0 of the transistor M0. In some embodiments of the present invention, the transistor off-resistance control circuit 104/204 may employ a replica transistor for achieving the objective of controlling the off-resistance Roff,0 of the transistor M0.

Figure 3:
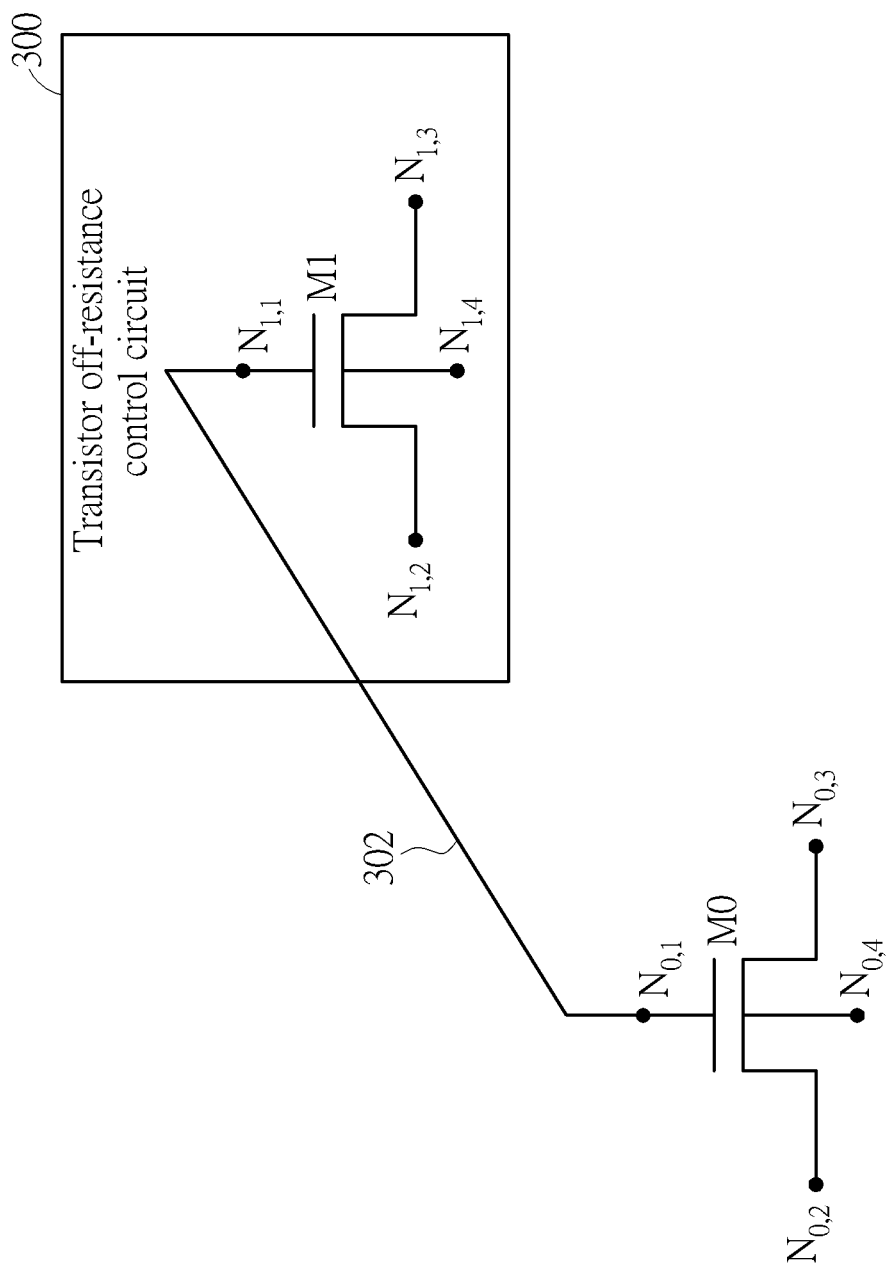
FIG. 3 is a diagram illustrating a first transistor off-resistance control circuit according to an embodiment of the present invention.

FIG. 3 is a diagram illustrating a first transistor off-resistance control circuit according to an embodiment of the present invention. The transistor off-resistance control circuit 104/204 may be implemented using the transistor off-resistance control circuit 300. The transistor off-resistance control circuit 300 includes a transistor M1 and may further include other circuit components (not shown), where the transistor M1 is a replica of the transistor M0. Since the leakage current of the transistor M0 that passes through the off-resistance Roff,0 is small, the transistor M1 may be implemented by a scaled replica N×M0 to facilitate the circuit design of the transistor off-resistance control circuit 300, where N is not restricted to be an integer. For example, the transistor M1 may be implemented by a plurality of replica transistors connected in parallel. As shown in FIG. 3, the transistor M1 is a four-terminal device including a control terminal (e.g., a gate terminal) $N_{1,1}$, two connection terminals (e.g., a source terminal and a drain terminal) $N_{1,2}$, $N_{1,3}$, and a body terminal $N_{1,4}$. In this embodiment, the control terminal (e.g., gate terminal) $N_{1,1}$ of the transistor M1 (which may be an NMOS transistor or a PMOS transistor) is directly connected to the control terminal (e.g., gate terminal) $N_{0,1}$ of the transistor M0 (which may be an NMOS transistor or a PMOS transistor). Hence, the control voltage generated at the control terminal (e.g., gate terminal) $N_{1,1}$ of the transistor M1 is mirrored to act as the control voltage at the control terminal (e.g., gate terminal) $N_{0,1}$ of the transistor M0. With the help of the direct connection 302 routed between the control terminal $N_{1,1}$ of the transistor M1 and the control terminal $N_{0,1}$ of the transistor M0, the off-resistance Roff,0 of the transistor M0 can be controlled by the transistor off-resistance control circuit 300 through setting the control voltage at the control terminal $N_{1,1}$ of the transistor M1.

Figure 4:
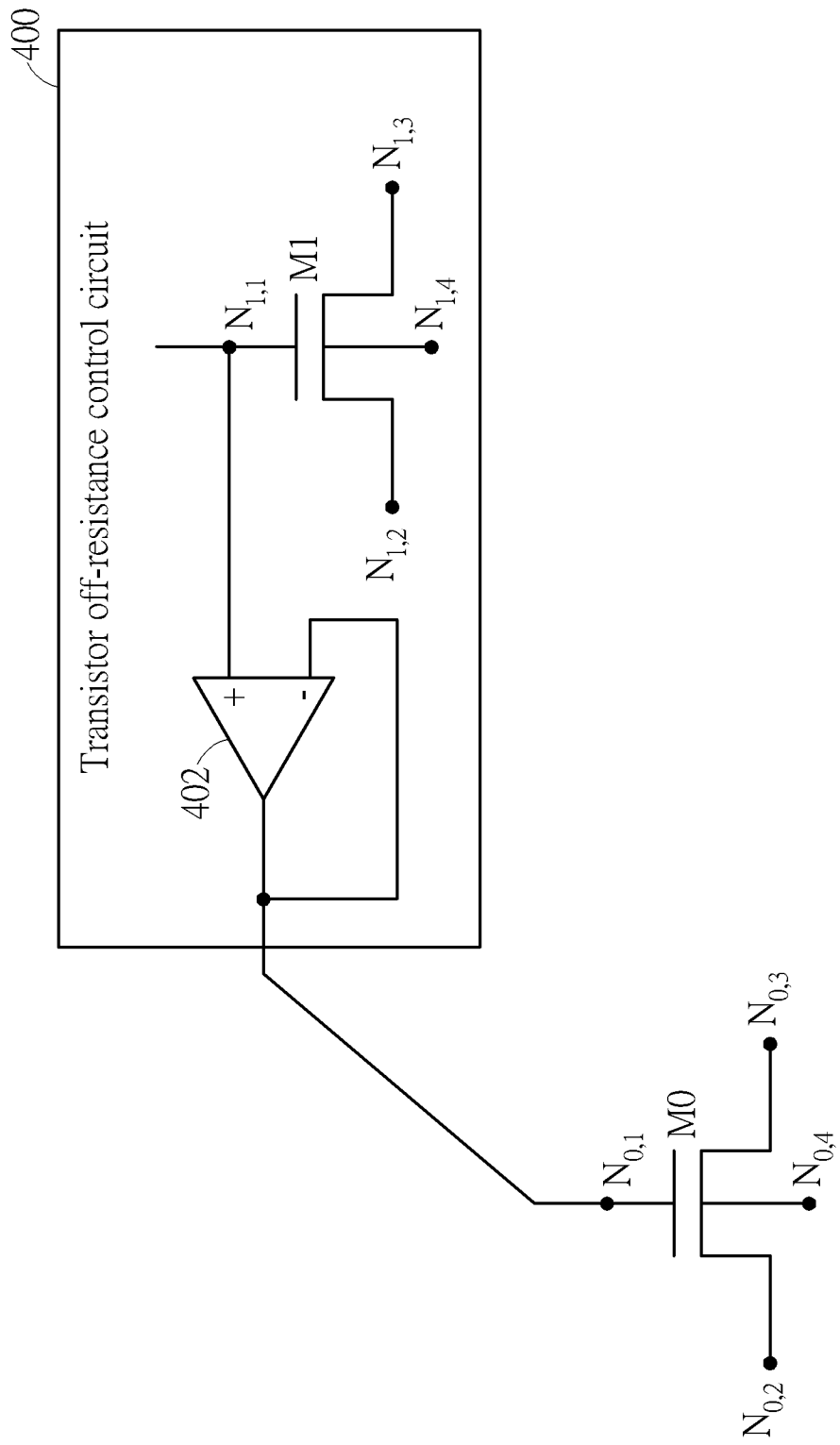
FIG. 4 is a diagram illustrating a second transistor off-resistance control circuit according to an embodiment of the present invention.

FIG. 4 is a diagram illustrating a second transistor off-resistance control circuit according to an embodiment of the present invention. The transistor off-resistance control circuit 104/204 may be implemented using the transistor off-resistance control circuit 400. The transistor off-resistance control circuit 400 includes an operational amplifier 402, the transistor M1 and other circuit components (not shown). The transistor M1 is a replica of the transistor M0, and can be a scaled replica N×M0 to facilitate the circuit design of the transistor off-resistance control circuit 400, where N is not restricted to be an integer. The major difference between the transistor off-resistance control circuits 300 and 400 is that the control terminal (e.g., gate terminal) $N_{1,1}$ of the transistor M1 is connected to the control terminal (e.g., gate terminal) $N_{0,1}$ of the transistor M0 via a buffer circuit that is implemented by the operational amplifier 402. For example, the buffer circuit may be a unity-gain buffer (also called a unity-gain amplifier). As shown in FIG. 4, the operational amplifier 402 has a non-inverting input terminal (+) coupled to the control terminal (e.g., gate terminal) $N_{1,1}$ of the transistor M1, and has an output terminal coupled to the control terminal (e.g., gate terminal) $N_{0,1}$ of the transistor M0 and an inverting input terminal (−) of the operational amplifier 402. Hence, the control voltage generated at the control terminal (e.g., gate terminal) $N_{1,1}$ of the transistor M1 is mirrored to act as the control voltage at the control terminal (e.g., gate terminal) $N_{0,1}$ of the transistor M0. With the help of the buffer circuit (e.g., unity-gain buffer) between the control terminal (e.g., gate terminal) $N_{1,1}$ of the transistor M1 and the control terminal (e.g., gate terminal) $N_{0,1}$ of the transistor M0, the off-resistance Roff,0 of the transistor M0 can be controlled by the transistor off-resistance control circuit 300 through setting the control voltage at the control terminal (e.g., gate terminal) of the transistor M1.

Figure 5:
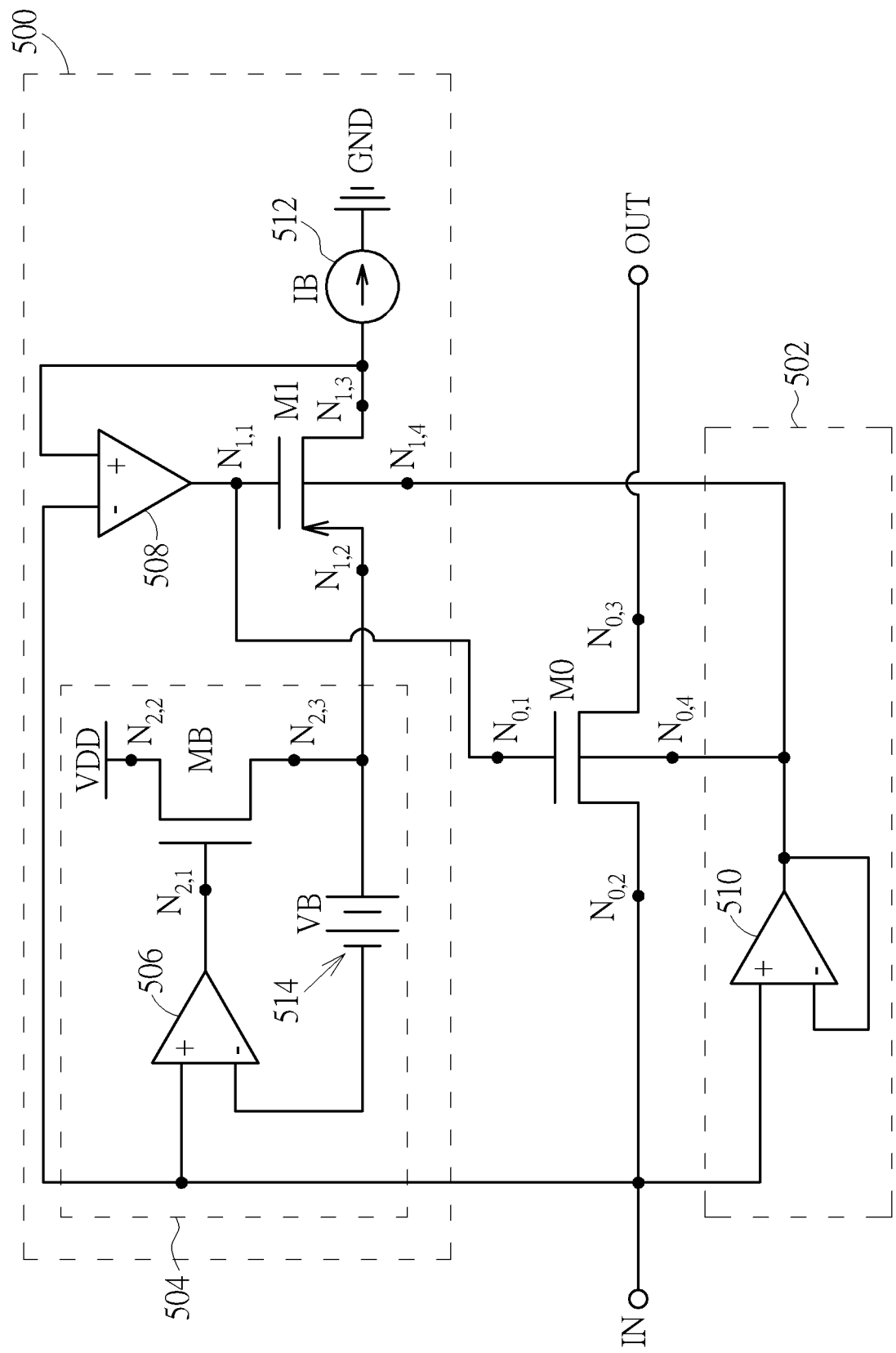
FIG. 5 is a diagram illustrating a third transistor off-resistance control circuit according to an embodiment of the present invention.

The transistor off-resistance control circuit 300/400 may have circuit components needed to set the control voltage at the control terminal (e.g., gate terminal) $N_{1,1}$ of the replica transistor M1. FIG. 5 is a diagram illustrating a third transistor off-resistance control circuit according to an embodiment of the present invention. The transistor off-resistance control circuit 104/204 may be implemented using the transistor off-resistance control circuit 500, and the transistor body-biasing circuit 106 may be implemented using the transistor body-biasing circuit 502. Regarding the transistor off-resistance control circuit 500, it includes a bias voltage generator circuit 504, the transistor M1 (which is a replica of the transistor M0), an operational amplifier 508, and a bias current generator circuit 512. In this embodiment, the transistor M1 is implemented by a PMOS transistor. The bias voltage generator circuit 504 is arranged to provide the connection terminal (i.e., source terminal) $N_{1,2}$ of the transistor M1 (which is a PMOS transistor) with a bias voltage VB. In this embodiment, the bias voltage generator circuit 504 includes an operational amplifier 506, a transistor MB, and a voltage source 514. The operational amplifier 506 has two input terminals (e.g., a non-inverting input terminal (+) and an inverting input terminal (−)) and an output terminal. The non-inverting input terminal (+) of the operational amplifier 506 is coupled to the connection terminal $N_{0,2}$ of the transistor M0, and the output terminal of the operational amplifier 506 is coupled to a control terminal (e.g., a gate terminal) of the transistor MB. The connection terminal $N_{2,2}$ of the transistor MB is arranged to receive a reference voltage (e.g., a supply voltage VDD), and the connection terminal $N_{2,3}$ of the transistor MB is coupled to the connection terminal (i.e., source terminal) $N_{1,2}$ of the transistor M1 (which is a PMOS transistor). The voltage source 514 is coupled between the inverting input terminal (−) of the operational amplifier 506 and the connection terminal (i.e., source terminal) $N_{1,2}$ of the transistor M1 (which is a PMOS transistor).

The operational amplifier 508 has two input terminals (e.g., a non-inverting input terminal (+) and an inverting input terminal (−)) and an output terminal. The output terminal of the operational amplifier 508 is coupled to the control terminal (i.e., gate terminal) of the transistor M1 (which is a PMOS transistor), the inverting input terminal (−) of the operational amplifier 508 is coupled to the connection terminal $N_{0,2}$ of the transistor M0, and the non-inverting input terminal (+) of the operational amplifier 508 is coupled to the connection terminal (i.e., drain terminal) $N_{1,3}$ of the transistor M1 (which is a PMOS transistor). Hence, due to inherent characteristics of the operational amplifier 508, the voltage at the connection terminal (i.e., drain terminal) $N_{1,3}$ of the transistor M1 (which is a PMOS transistor) is similar to the voltage at the connection terminal $N_{0,2}$ of the transistor M0.

The bias current generator 512 is arranged to provide the connection terminal (i.e., drain terminal) $N_{1,3}$ of the transistor M1 (which is a PMOS transistor) with a bias current IB. In this embodiment, the bias current generator 512 is coupled between the connection terminal (i.e., drain terminal) $N_{1,3}$ of the transistor M1 (which is a PMOS transistor) and a reference voltage (e.g., a ground voltage GND).

Hence, the bias voltage VB at the connection terminal (i.e., source terminal) $N_{1,2}$ of the transistor M1 (which is a PMOS transistor) is configured to be higher than the voltage at the connection terminal (i.e., drain terminal) $N_{1,3}$ of the transistor M1 (which is a PMOS transistor), and the bias current IB is configured to flow from the connection terminal (i.e., drain terminal) $N_{1,3}$ of the transistor M1 (which is a PMOS transistor) towards the reference voltage (e.g., ground voltage GND).

In this embodiment, the off-resistance Roff,1 of the transistor M1 is defined by VB/IB. Since the control voltage (e.g., gate voltage) at the control terminal $N_{1,1}$ of the transistor M1 (which is a replica of the transistor M0, such as N×M0) is mirrored to act as the control voltage (e.g., gate voltage) at the control terminal $N_{0,1}$ of the transistor M0, the off-resistance Roff,0 of the transistor M0 is defined by $$\frac{VB}{IB} \times N.$$

Hence, with proper settings of controllable bias voltage VB and controllable bias current IB at the transistor off-resistance control circuit 400, controllable off-resistance Roff,0 of the transistor M0 can be achieved. For example, the off-resistance Roff,0 of the transistor M0 can be reduced to make the noise filter circuit 100/200 meet requirements of an application such as faster settling time, smaller operational amplifier output voltage, and smaller V_OUT/V_IN mismatch.

Figure 6:
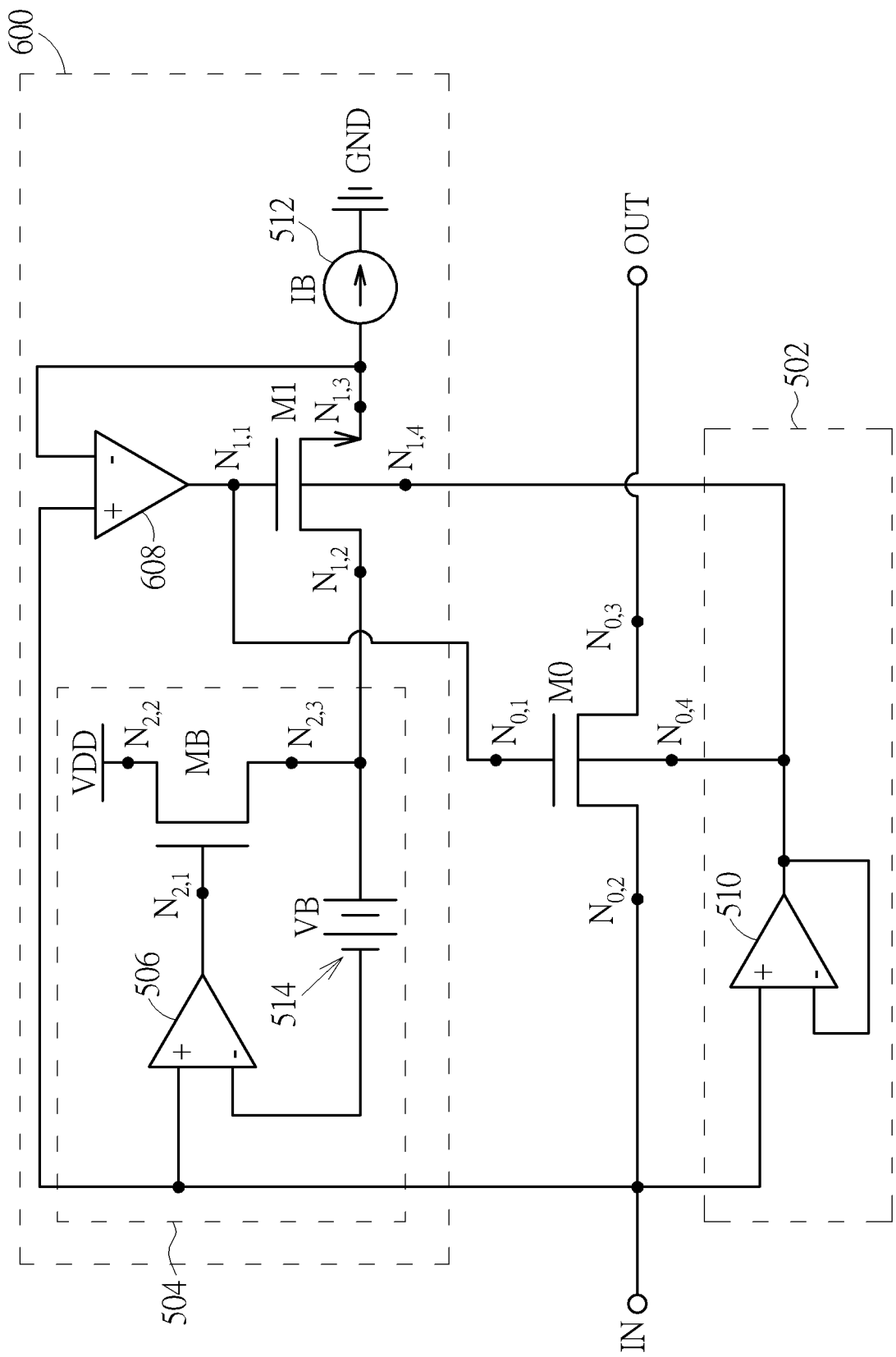
FIG. 6 is a diagram illustrating a fourth transistor off-resistance control circuit according to an embodiment of the present invention.

The transistor M1 is a replica of the transistor M0, and can be a scaled replica N×M0 to facilitate the circuit design of the transistor off-resistance control circuit, where N is not restricted to be an integer. It should be noted that the transistor M1 is not restricted to be a PMOS transistor shown in FIG. 5. Alternatively, the replica transistor may be implemented by an NMOS transistor. FIG. 6 is a diagram illustrating a fourth transistor off-resistance control circuit according to an embodiment of the present invention. The transistor off-resistance control circuit 104/204 may be implemented using the transistor off-resistance control circuit 600, and the transistor body-biasing circuit 106 may be implemented using the transistor body-biasing circuit 502. The major difference between the transistor off-resistance control circuits 500 and 600 is that the transistor M1 in the transistor off-resistance control circuit 600 is implemented by an NMOS transistor with the control terminal $N_{1,1}$ being a gate terminal, the connection terminal $N_{1,2}$ being a drain terminal, and the connection terminal $N_{1,3}$ being a source terminal, and the operational amplifier 608 included in the transistor off-resistance control circuit 600 has a non-inverting input terminal (+) coupled to the connection terminal $N_{0,2}$ of the transistor M0 and an inverting terminal (−) coupled to the connection terminal (i.e., source terminal) $N_{1,3}$ of the transistor M1 (which is an NMOS transistor).

In the embodiments shown in FIG. 5 and FIG. 6, the bias voltage VB at the connection terminal $N_{1,2}$ of the transistor M1 is configured to be higher than the voltage at the connection terminal $N_{1,3}$ of the transistor M1, and the bias current IB is configured to flow from the connection terminal $N_{1,3}$ of the transistor M1 towards the reference voltage (e.g., ground voltage GND). However, this is for illustrative purposes only, and is not meant to be a limitation of the present invention. In practice, the bias current IB can be a controllable bias current, and/or the bias voltage VB can be a controllable bias voltage.

Figure 7:
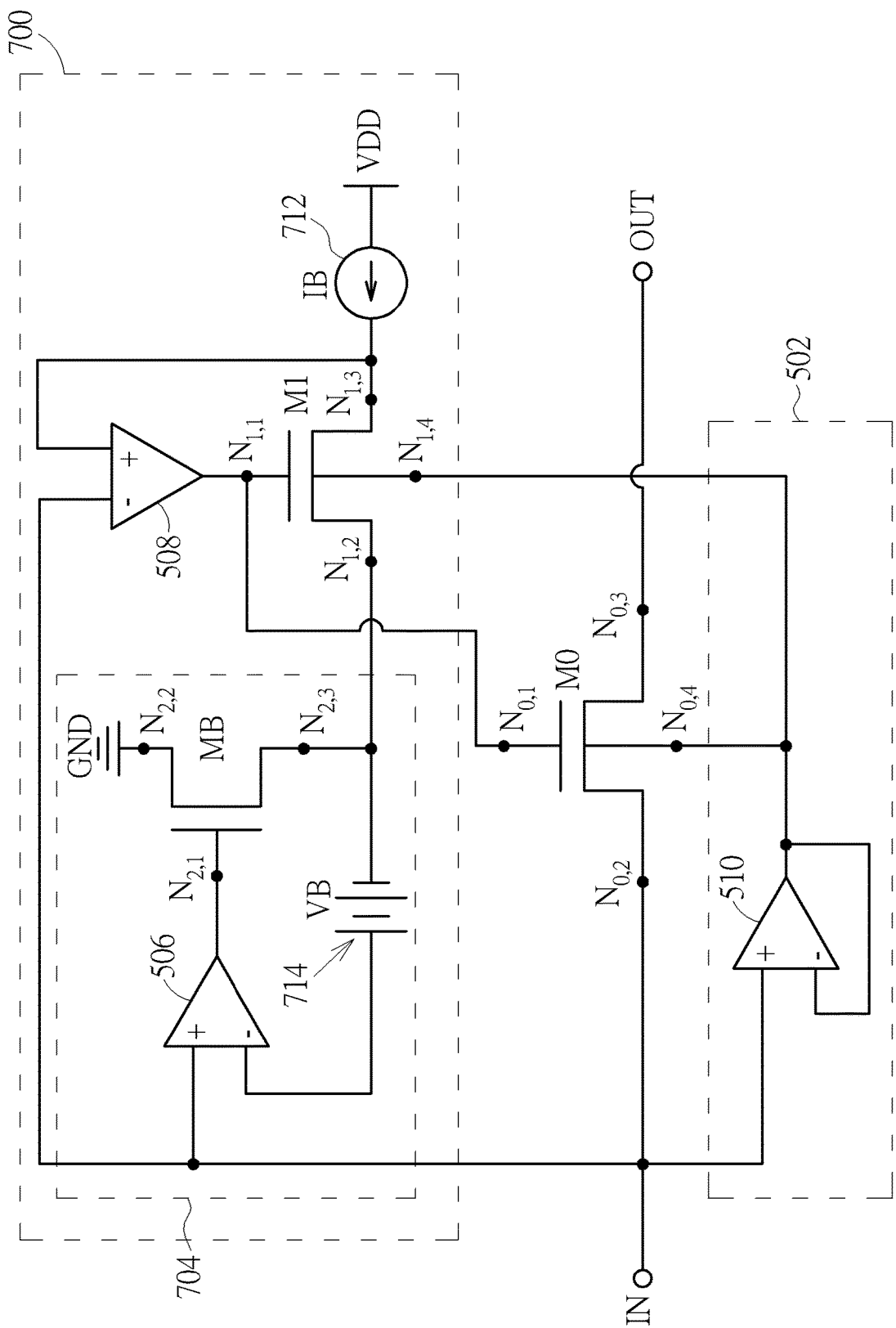
FIG. 7 is a diagram illustrating a fifth transistor off-resistance control circuit according to an embodiment of the present invention.

FIG. 7 is a diagram illustrating a fifth transistor off-resistance control circuit according to an embodiment of the present invention. The transistor off-resistance control circuit 104/204 may be implemented using the transistor off-resistance control circuit 700, and the transistor body-biasing circuit 106 may be implemented using the transistor body-biasing circuit 502. In this embodiment, the transistor off-resistance control circuit 700 has a bias current generator circuit 712 arranged to provide the connection terminal $N_{1,3}$ of the transistor M1 (which may be a PMOS transistor or an NMOS transistor) with the bias current IB, where the bias current generator circuit 712 is coupled between the connection terminal $N_{1,3}$ of the transistor M1 (which may be a PMOS transistor or an NMOS transistor) and a reference voltage (e.g., supply voltage VDD), and the bias current IB is configured to flow from the reference voltage (e.g., supply voltage VDD) towards the connection terminal $N_{1,3}$ of the transistor M1 (which may be a PMOS transistor or an NMOS transistor). In addition, the connection terminal $N_{2,2}$ of the transistor MB included in the bias voltage generator circuit 704 is coupled to another reference voltage (e.g., ground voltage GND), and the voltage source 714 included in the bias voltage generator circuit 704 is arranged to provide the connection terminal $N_{1,2}$ of the transistor M1 (which may be a PMOS transistor or an NMOS transistor) with the bias voltage VB that is configured to be lower than the voltage at the connection terminal $N_{1,3}$ of the transistor M1.

In this embodiment, the off-resistance Roff,1 of the transistor M1 is defined by VB/IB. Since the control voltage (e.g., gate voltage) at the control terminal $N_{1,1}$ of the transistor M1 (which is a replica of the transistor M0, such as N×M0) is mirrored to act as the control voltage (e.g., gate voltage) at the control terminal $N_{0,1}$ of the transistor M0, the off-resistance Roff,0 of the transistor M0 is defined by $$\frac{VB}{IB} \times N.$$

Hence, with proper settings of controllable bias voltage VB and controllable bias current IB at the transistor off-resistance control circuit 700, controllable off-resistance Roff,0 of the transistor M0 can be achieved. For example, the off-resistance Roff,0 of the transistor M0 can be reduced to make the noise filter circuit 100/200 meet requirements of an application such as faster settling time, smaller amplifier output voltage, and smaller V_OUT/V_IN mismatch.

In above embodiments, the bias voltage VB is created by the voltage source 514/714 coupled between the inverting input terminal (−) of the operational amplifier 506 and the connection terminal $N_{1,2}$ of the transistor M1. However, this is for illustrative purposes only, and is not meant to be a limitation of the present invention. In practice, any means capable of generating and applying the bias voltage VB to the connection terminal $N_{1,2}$ of the transistor M1 may be employed by the bias voltage generator circuit.

Figure 8:
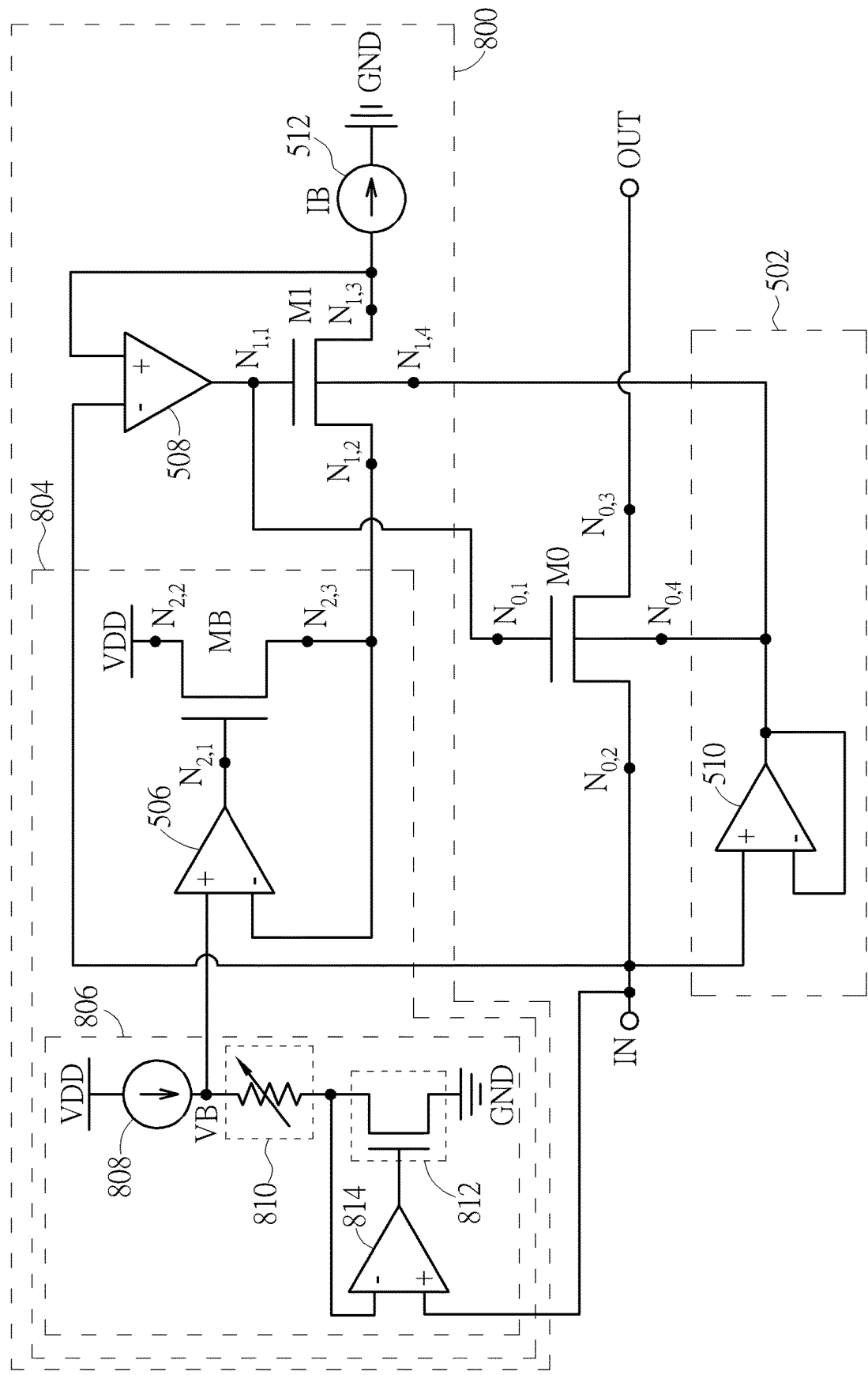
FIG. 8 is a diagram illustrating a sixth transistor off-resistance control circuit according to an embodiment of the present invention.

FIG. 8 is a diagram illustrating a sixth transistor off-resistance control circuit according to an embodiment of the present invention. The transistor off-resistance control circuit 104/204 may be implemented using the transistor off-resistance control circuit 800, and the transistor body-biasing circuit 106 may be implemented using the transistor body-biasing circuit 502. The major difference between the bias voltage generator circuits 504 and 804 is that the bias voltage generator circuit 804 further includes a voltage generator circuit 806 arranged to provide the bias voltage VB, and the inverting input terminal (−) of the operational amplifier 506 is coupled to the connection terminal $N_{1,2}$ of the transistor M1 without via any voltage source. In this embodiment, the voltage generator circuit 806 includes a constant current source 808, a variable resistor 810, a transistor 812, and an operational amplifier 814. The variable resistor 810 has one end coupled to the non-inverting input terminal (+) of the operational amplifier 506 and the constant current source 808. Hence, the bias voltage VB established at one end of the variable resistor 810 is applied to the non-inverting input terminal (+) of the operational amplifier 506. Since the resistance value of the variable resistor 810 is adjustable, the bias voltage VB is a controllable bias voltage that can be set to a desired value by tuning the variable resistor 810.

Figure 9:
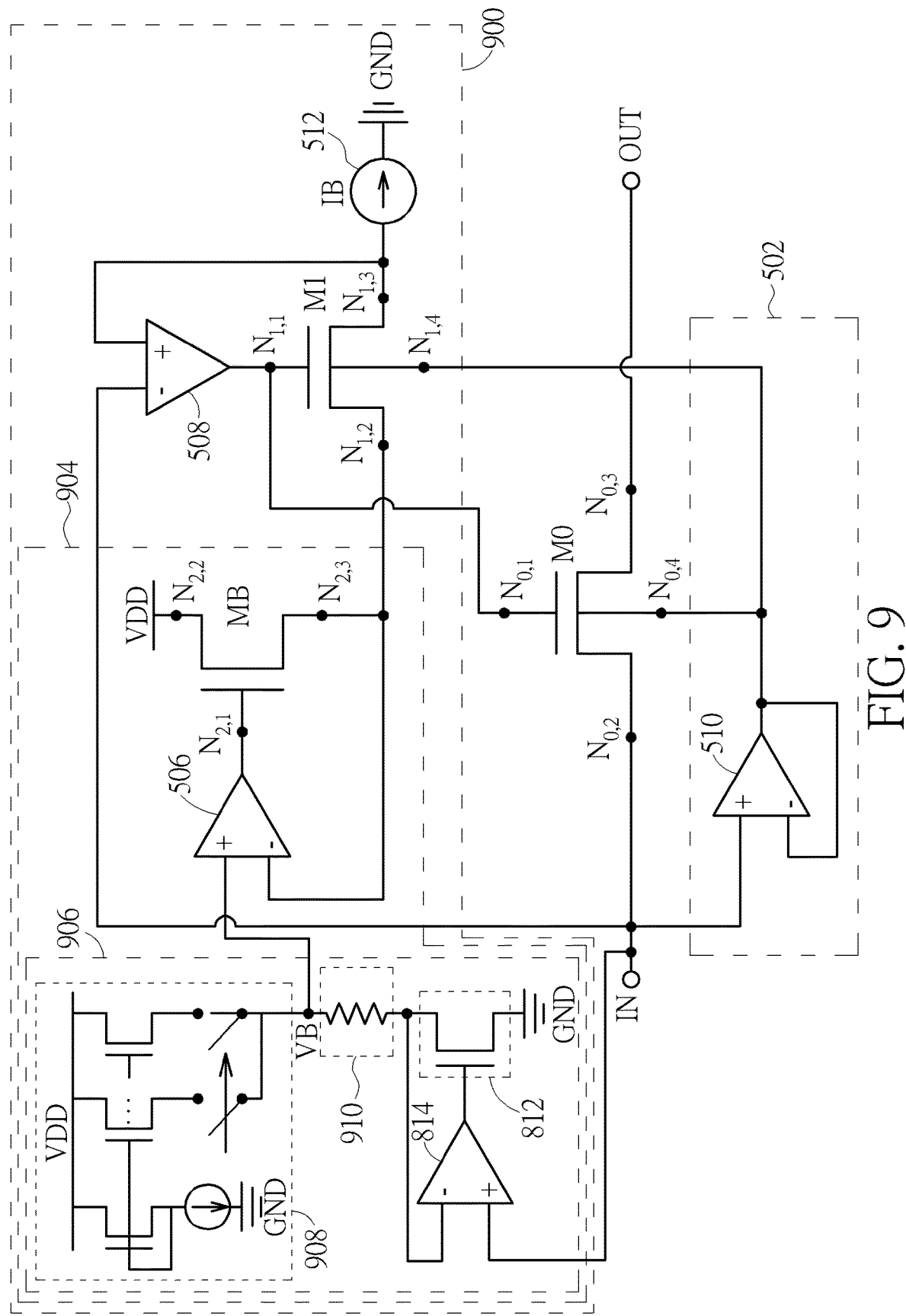
FIG. 9 is a diagram illustrating a seventh transistor off-resistance control circuit according to an embodiment of the present invention.

FIG. 9 is a diagram illustrating a seventh transistor off-resistance control circuit according to an embodiment of the present invention. The transistor off-resistance control circuit 104/204 may be implemented using the transistor off-resistance control circuit 900, and the transistor body-biasing circuit 106 may be implemented using the transistor body-biasing circuit 502. The major difference between the bias voltage generator circuits 904 and 804 is that a voltage generator circuit 906 of the bias voltage generator circuit 904 is arranged to generate the bias voltage VB through a variable current source 908 and a fixed resistor 910. The fixed resistor 910 has one end coupled to the non-inverting input terminal (+) of the operational amplifier 506 and the variable current source 908. Hence, the bias voltage VB established at one end of the fixed resistor 910 is applied to the non-inverting input terminal (+) of the operational amplifier 506. Since the current provided from the variable current source 908 to the fixed resistor 910 is adjustable, the bias voltage VB is a controllable bias voltage that can be set to a desired value by tuning the variable current source 908. It should be noted that the present invention has no limitations on the design of the variable current source. In other words, any variable current source can be employed by the bias voltage generator circuit 904.

The transistor MB included in the bias voltage generator circuit 505/704/804/904 may be implemented by a PMOS transistor or an NMOS transistor, depending upon actual design considerations.

Figure 10:
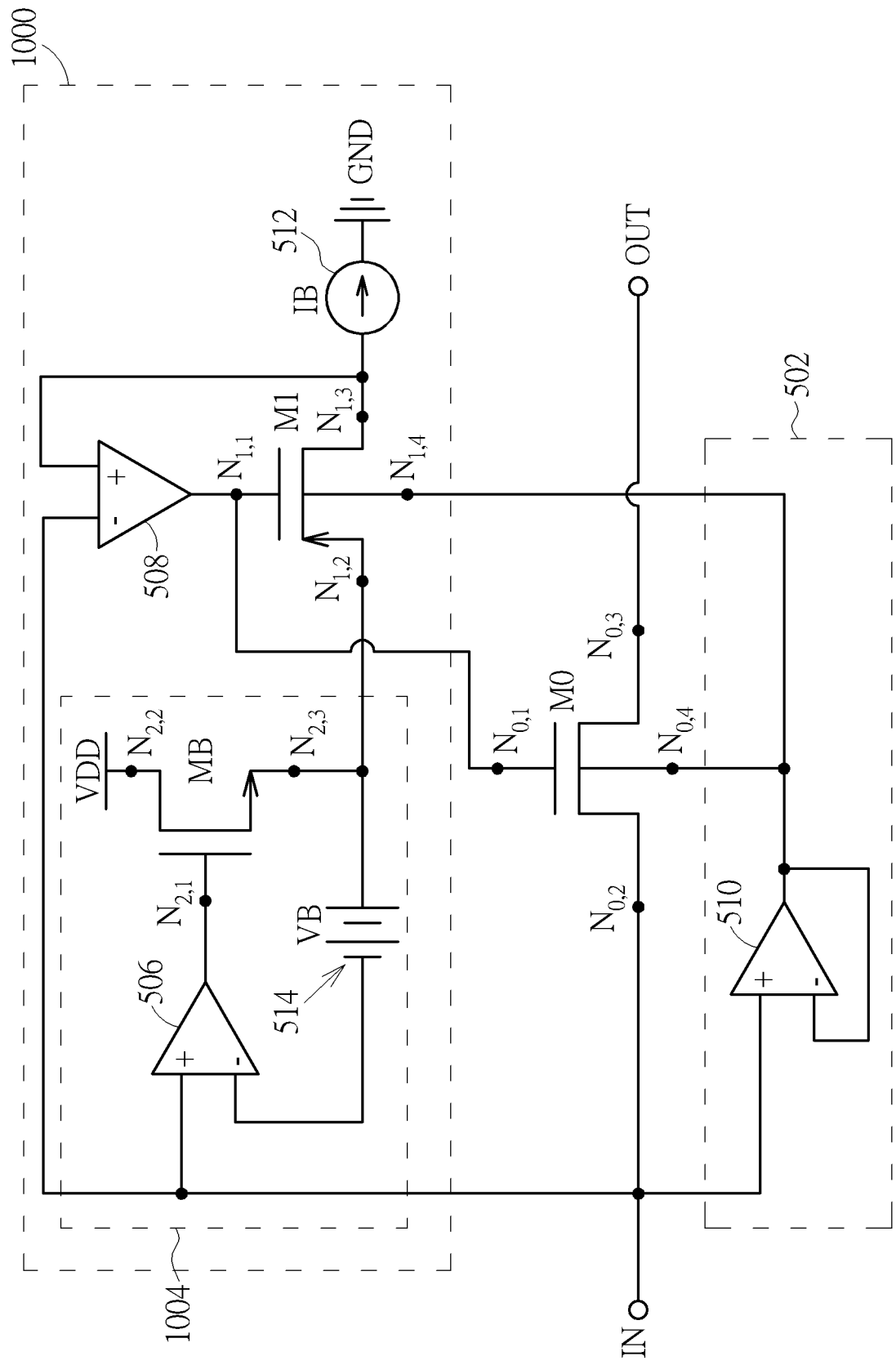
FIG. 10 is a diagram illustrating an eighth transistor off-resistance control circuit according to an embodiment of the present invention.

FIG. 10 is a diagram illustrating an eighth transistor off-resistance control circuit according to an embodiment of the present invention. The transistor off-resistance control circuit 104/204 may be implemented using the transistor off-resistance control circuit 1000, and the transistor body-biasing circuit 106 may be implemented using the transistor body-biasing circuit 502. In this embodiment, the transistor MB included in the bias voltage generator circuit 1004 is implemented by an NMOS transistor with the control terminal $N_{2,1}$ being a gate terminal, the connection terminal $N_{2,2}$ being a drain terminal, and the connection terminal $N_{2,3}$ being a source terminal.

Figure 11:
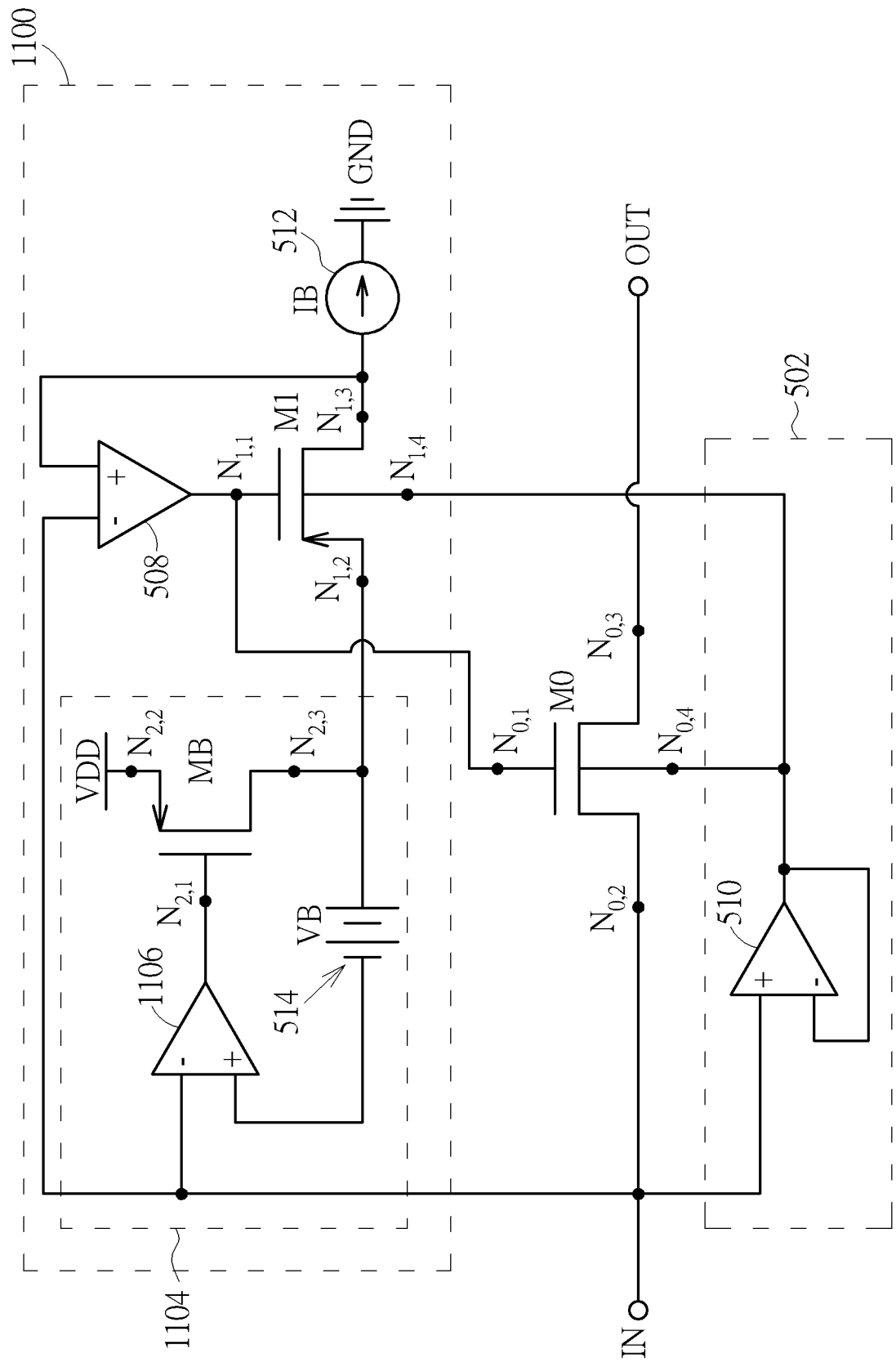
FIG. 11 is a diagram illustrating a ninth transistor off-resistance control circuit according to an embodiment of the present invention.

FIG. 11 is a diagram illustrating a ninth transistor off-resistance control circuit according to an embodiment of the present invention. The transistor off-resistance control circuit 104/204 may be implemented using the transistor off-resistance control circuit 1100, and the transistor body-biasing circuit 106 may be implemented using the transistor body-biasing circuit 502. In this embodiment, the transistor MB included in the bias voltage generator circuit 1104 is implemented by a PMOS transistor with the control terminal $N_{2,1}$ being a gate terminal, the connection terminal $N_{2,2}$ being a source terminal, and the connection terminal $N_{2,3}$ being a drain terminal. In addition, an operational amplifier 1106 included in the bias voltage generator circuit 1104 has a non-inverting input terminal (+) coupled to the voltage source 514, and an inverting input terminal (−) coupled to the connection terminal $N_{0,2}$ of the transistor M0 and the inverting input terminal (−) of the operational amplifier 508.

With regard to the transistor body-biasing circuit 502 shown in FIGS. 5-11, it includes an operational amplifier 510 configured to act as a unity-gain buffer (also called a unity-gain amplifier), where the non-inverting input terminal (+) of the operational amplifier 510 is coupled to the connection terminal $N_{0,2}$ of the transistor M0, and the output terminal of the of the operational amplifier 510 is coupled to the inverting input terminal (−) of the operational amplifier 510, the body terminal $N_{0,4}$ of the transistor M0, and the body terminal $N_{1,4}$ of the transistor M1. Due to inherent characteristics of the unity-gain buffer, the operational amplifier 510 drives the bulk/body/substrate of both transistors M0 and M1 by the same voltage (e.g., V_IN) at the connection terminal $N_{0,2}$ of the transistor M0. However, this is for illustrative purposes only, and is not meant to be a limitation of the present invention. In practice, any means capable of making the bulk/body/substrate of both transistors M0 and M1 biased at the same voltage or similar voltages can be employed by the noise filter circuit 100/200.

Figure 12:
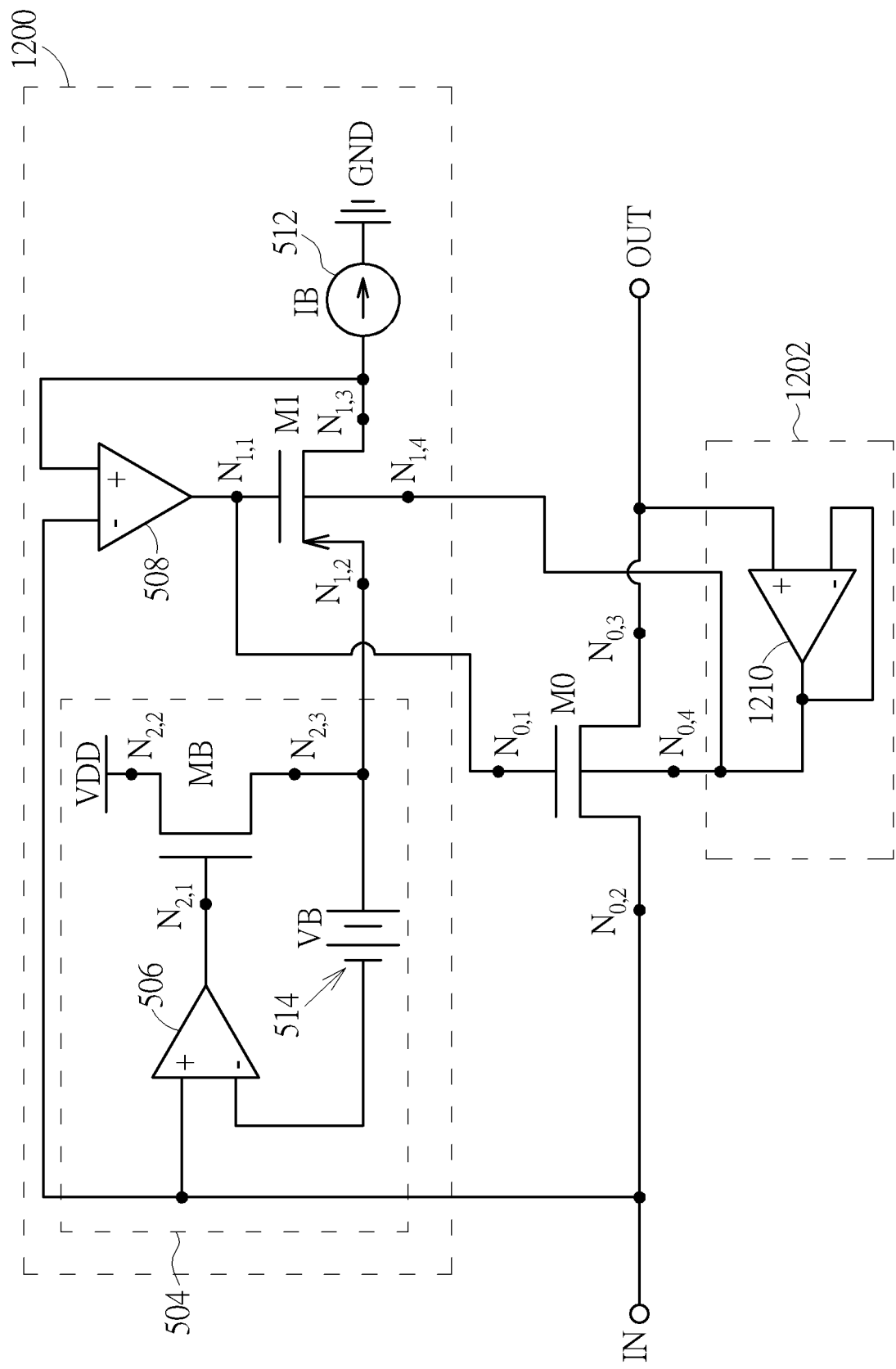
FIG. 12 is a diagram illustrating a tenth transistor off-resistance control circuit according to an embodiment of the present invention.

FIG. 12 is a diagram illustrating a tenth transistor off-resistance control circuit according to an embodiment of the present invention. The transistor off-resistance control circuit 104/204 may be implemented using the transistor off-resistance control circuit 1200, and the transistor body-biasing circuit 106 may be implemented using the transistor body-biasing circuit 1202. The transistor body-biasing circuit 1202 includes an operational amplifier 1210 configured to act as a unity-gain buffer (also called a unity-gain amplifier), where the non-inverting input terminal (+) of the operational amplifier 1210 is coupled to the connection terminal $N_{0,3}$ of the transistor M0, and the output terminal of the of the operational amplifier 1210 is coupled to the inverting input terminal (−) of the operational amplifier 1210, the body terminal $N_{0,4}$ of the transistor M0, and the body terminal $N_{1,4}$ of the transistor M1. Due to inherent characteristics of the unity-gain buffer, the operational amplifier 1210 drives the bulk/body/substrate of both transistors M0 and M1 by the same voltage (e.g., V_OUT) at the connection terminal $N_{0,3}$ of the transistor M0.

Figure 13:
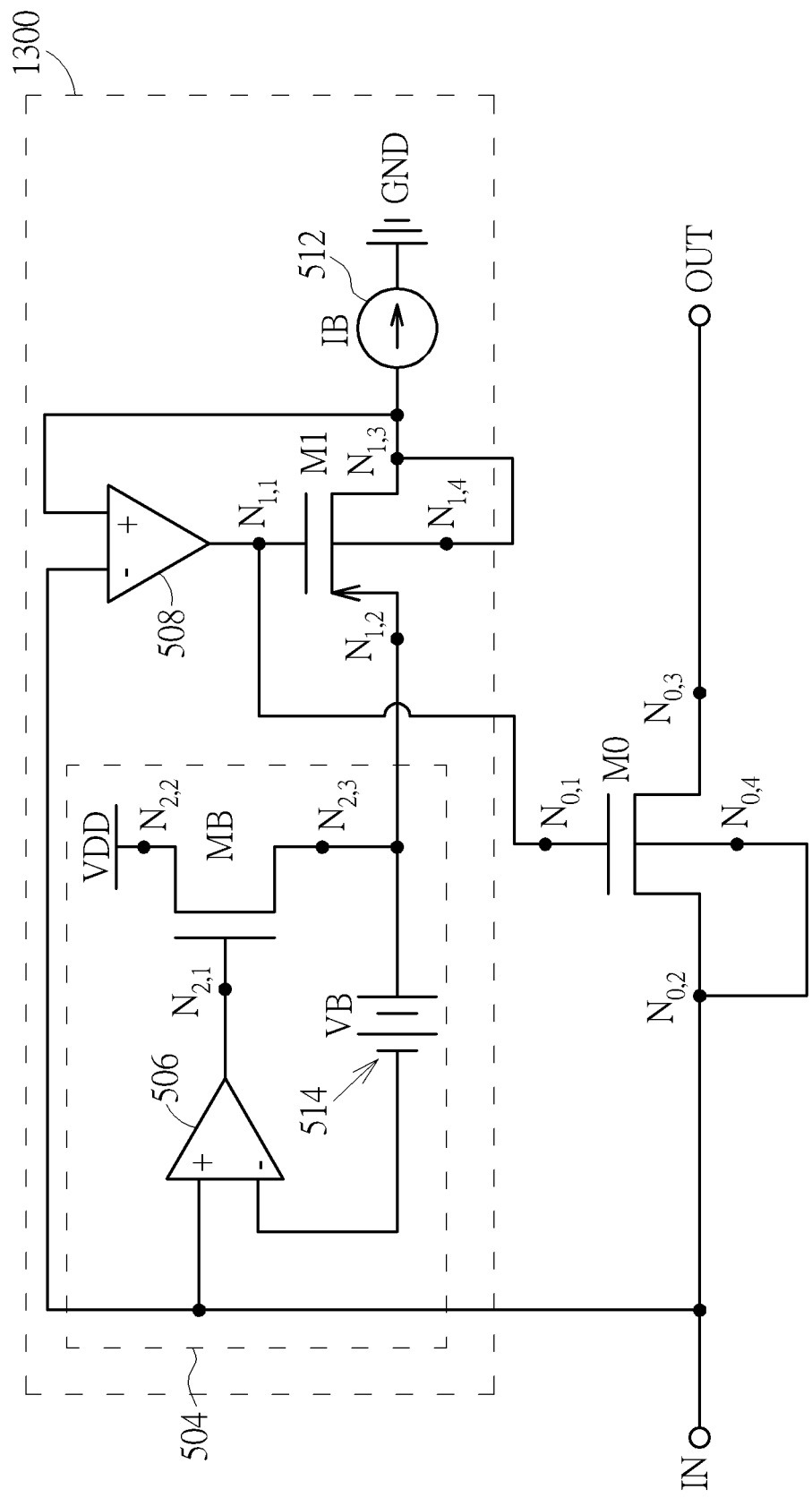
FIG. 13 is a diagram illustrating an eleventh transistor off-resistance control circuit according to an embodiment of the present invention.

FIG. 13 is a diagram illustrating an eleventh transistor off-resistance control circuit according to an embodiment of the present invention. The transistor off-resistance control circuit 104/204 may be implemented using the transistor off-resistance control circuit 1300. The noise filter circuit 100/200 may be modified to omit the transistor body-biasing circuit 106. Since there is no transistor body-biasing circuit 106, a body terminal of a transistor can be tied to a source terminal of the same transistor. For example, the transistor M0 may be a PMOS transistor with the body terminal $N_{0,4}$ coupled to the connection terminal (i.e., source terminal) $N_{0,2}$ at which the input voltage V_IN is received by the RC based filter 102; and the transistor M1 may be an NMOS transistor with the body terminal $N_{1,4}$ coupled to the connection terminal (i.e., source terminal) $N_{1,3}$.

Figure 14:
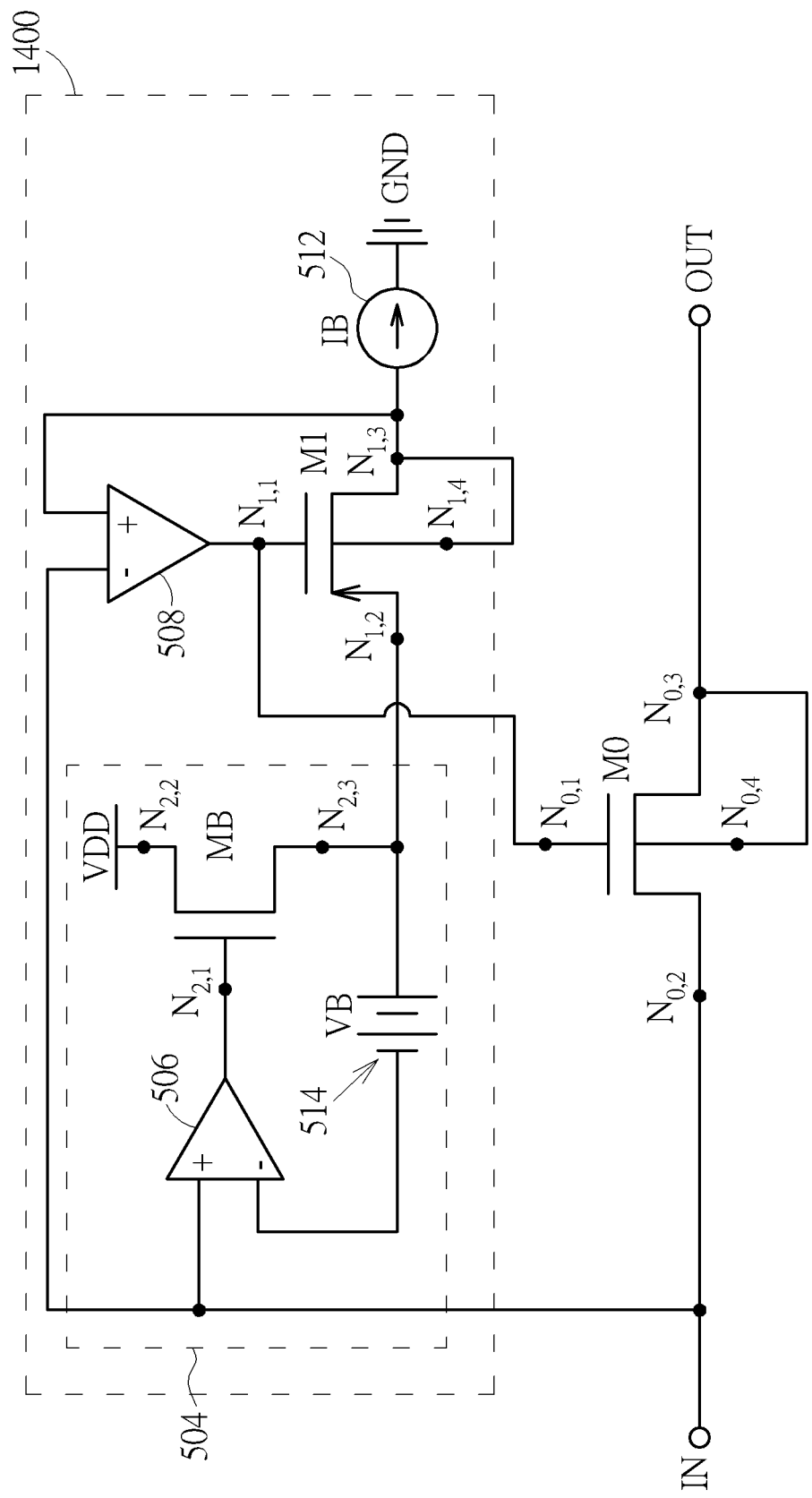
FIG. 14 is a diagram illustrating a twelfth transistor off-resistance control circuit according to an embodiment of the present invention.

FIG. 14 is a diagram illustrating a twelfth transistor off-resistance control circuit according to an embodiment of the present invention. The transistor off-resistance control circuit 104/204 may be implemented using the transistor off-resistance control circuit 1400. The noise filter circuit 100/200 may be modified to omit the transistor body-biasing circuit 106. Since there is no transistor body-biasing circuit

106, a body terminal of a transistor can be tied to a source terminal of the same transistor. For example, the transistor M0 may be an NMOS transistor with the body terminal $N_{0,4}$ coupled to the connection terminal (i.e., source terminal) $N_{0,3}$ at which the output voltage V_OUT is output from the RC based filter 102; and the transistor M1 may be an NMOS transistor with the body terminal $N_{1,4}$ coupled to the connection terminal (i.e., source terminal) $N_{1,3}$.

It should be noted that the scope of the present invention is not limited by the aforementioned embodiments. Any noise filter circuit design using one or more features supported by embodiments mentioned above falls within the scope of the present invention. For example, a noise filter circuit design using features directed to a replica transistor M1 not restricted to an NMOS transistor or a PMOS transistor, a controllable bias current IB, a controllable bias voltage VB, a transistor MB not restricted to an NMOS transistor or a PMOS transistor, and/or a transistor M0 and a replica transistor M1 biased at the same voltage or similar voltages falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A noise filter circuit comprising:
    a filter, comprising:
        a first transistor, arranged to have off-resistance when turned off or operated under sub-threshold region, wherein the first transistor comprises:
            a control terminal, arranged to receive a first control voltage, wherein the control terminal is not directly tied to a reference voltage;
            a first connection terminal; and
            a second connection terminal; and
        a charge storage component, having one terminal coupled to the second connection terminal of the first transistor; and
    a transistor off-resistance control circuit, coupled to the first transistor and arranged to set the first control voltage for controlling the off-resistance of the first transistor.

2. The noise filter circuit of claim 1, wherein the filter is a low-pass filter, the first connection terminal is arranged to receive an input voltage of the low-pass filter, and the second connection terminal is arranged to output an output voltage of the low-pass filter.

3. The noise filter circuit of claim 1, wherein the first transistor is located at a forward path of the noise filter circuit, the noise filter circuit further comprises a second transistor located at a feedback path of the noise filter circuit and arranged to have off-resistance when turned off or operated under sub-threshold region, the second transistor has a control terminal arranged to receive a second control voltage, the control terminal of the second transistor is not directly tied to a reference voltage, and the transistor off-resistance control circuit is further coupled to the second transistor and arranged to set the second control voltage for controlling the off-resistance of the second transistor.

4. The noise filter circuit of claim 1, wherein the transistor off-resistance control circuit comprises:
    a second transistor, being a replica of the first transistor and comprising:
        a control terminal, arranged to generate a second control voltage;
        a first connection terminal; and
        a second connection terminal;
    wherein the second control voltage at the control terminal of the second transistor is mirrored to act as the first control voltage of the first transistor.

5. The noise filter circuit of claim 4, wherein the control terminal of the second transistor is directly connected to the control terminal of the first transistor.

6. The noise filter circuit of claim 4, wherein the transistor off-resistance control circuit further comprises:
    a buffer circuit, having an input terminal coupled the control terminal of the second transistor and an output terminal coupled to the control terminal of the first transistor.

7. The noise filter circuit of claim 4, wherein the transistor off-resistance control circuit further comprises:
    a bias voltage generator circuit, arranged to provide the first connection terminal of the second transistor with a bias voltage; and
    a bias current generator circuit, arranged to provide the second connection terminal of the second transistor with a bias current.

8. The noise filter circuit of claim 7, wherein the bias voltage at the first connection terminal of the second transistor is configured to be higher than a voltage at the second connection terminal of the second transistor, and the bias current is configured to flow from the second connection terminal of the second transistor towards a reference voltage.

9. The noise filter circuit of claim 7, wherein the bias voltage at the first connection terminal of the second transistor is configured to be lower than a voltage at the second connection terminal of the second transistor, and the bias current is configured to flow from a reference voltage towards the second connection terminal of the second transistor.

10. The noise filter circuit of claim 7, wherein the bias voltage generator circuit comprises:
    an operational amplifier, comprising:
        a first input terminal, arranged to receive the input voltage of the noise filter circuit;
        a second input terminal; and
        an output terminal;
    a third transistor, comprising:
        a control terminal, coupled to the output terminal of the operational amplifier;
        a first connection terminal, arranged to receive a reference voltage; and
        a second connection terminal, coupled to the first connection terminal of the second transistor; and
    a voltage source, coupled between the second input terminal of the operational amplifier and the first connection terminal of the second transistor, wherein the voltage source is arranged to provide the bias voltage.

11. The noise filter circuit of claim 7, wherein the bias voltage generator circuit comprises:
    a voltage generator circuit, arranged to provide the bias voltage; and
    an operational amplifier, comprising:
        a first input terminal, coupled to the voltage generator circuit and arranged to receive the bias voltage;
        a second input terminal, coupled to the first connection terminal of the second transistor; and
        an output terminal;
    a third transistor, comprising:
        a control terminal, coupled to the output terminal of the operational amplifier;

a first connection terminal, arranged to receive a reference voltage; and a second connection terminal, coupled to the first connection terminal of the second transistor.

12. The noise filter circuit of claim 11, wherein the voltage generator circuit comprises:
   a variable resistor, having one end coupled to the first input terminal of the operational amplifier; and
   a constant current source, coupled to said one end of the variable resistor.

13. The noise filter circuit of claim 11, wherein the voltage generator circuit comprises:
   a fixed resistor, having one end coupled to the first input terminal of the operational amplifier; and
   a variable current source, coupled to said one end of the fixed resistor.

14. The noise filter circuit of claim 4, wherein the transistor off-resistance control circuit further comprises:
   an operational amplifier, comprising:
      a first input terminal, coupled to the first connection terminal of the first transistor;
      a second input terminal, coupled to the second connection terminal of the second transistor; and
      an output terminal, coupled to the control terminal of the second transistor.

15. The noise filter circuit of claim 4, wherein the transistor off-resistance control circuit further comprises:
   a transistor body-biasing circuit, arranged to generate and apply a same body voltage to both of the first transistor and the second transistor.

16. The noise filter circuit of claim 15, wherein the transistor body-biasing circuit comprises:
   an operational amplifier, comprising:
      a first input terminal, coupled to the first connection terminal of the first transistor;
      a second input terminal; and
      an output terminal, coupled to the second input terminal of the operational amplifier, a body terminal of the first transistor, and a body terminal of the second transistor.

17. The noise filter circuit of claim 15, wherein the transistor body-biasing circuit comprises:
   an operational amplifier, comprising:
      a first input terminal, coupled to the second connection terminal of the first transistor;
      a second input terminal; and
      an output terminal, coupled to the second input terminal of the operational amplifier, a body terminal of the first transistor, and a body terminal of the second transistor.

18. The noise filter circuit of claim 4, wherein a body terminal of the first transistor is tied to the first connection terminal of the first transistor, and a body terminal of the second transistor is tied to the second connection terminal of the second transistor.

19. The noise filter circuit of claim 4, wherein a body terminal of the first transistor is tied to the second connection terminal of the first transistor, and a body terminal of the second transistor is tied to the second connection terminal of the second transistor.

20. A noise filtering method comprising:
   setting a control voltage at a control terminal of a transistor for controlling off-resistance of the transistor, wherein the control terminal of the transistor is not directly tied to a reference voltage; and
   performing a filtering operation upon an input voltage to generate an output voltage, wherein the filtering operation is based on the transistor and a charge storage component.

* * * * *